(12) United States Patent
Ko et al.

(10) Patent No.: US 9,981,872 B2
(45) Date of Patent: May 29, 2018

(54) SINGLE LAYER SMART WINDOW

(71) Applicant: AJOU UNIVERSITY INDUSTRY-ACADEMIC COOPERATION FOUNDATION, Suwon-si, Gyeonggi-do (KR)

(72) Inventors: Kyung Hyun Ko, Seoul (KR); Jun Oh Choi, Seoul (KR)

(73) Assignee: AJOU UNIVERSITY INDUSTRY-ACADEMIC COOPERATION FOUNDATION, Suwon-si (KR)

(*) Notice: Subject to any disclaimer, the term of this patent is extended or adjusted under 35 U.S.C. 154(b) by 0 days. days.

(21) Appl. No.: 15/369,011

(22) Filed: Dec. 5, 2016

(65) Prior Publication Data

US 2017/0158554 A1   Jun. 8, 2017

(30) Foreign Application Priority Data

Dec. 3, 2015 (KR) .............................. 2015-0171163

(51) Int. Cl.
| | | |
|---|---|---|
| B32B 15/04 | (2006.01) | |
| B32B 17/06 | (2006.01) | |
| C03C 17/245 | (2006.01) | |
| C23C 14/34 | (2006.01) | |
| C23C 14/08 | (2006.01) | |

(52) U.S. Cl.
CPC ............ *C03C 17/245* (2013.01); *C23C 14/08* (2013.01); *C23C 14/083* (2013.01); *C23C 14/3464* (2013.01); *C03C 2217/218* (2013.01); *C03C 2217/23* (2013.01); *C03C 2217/732* (2013.01); *C03C 2218/154* (2013.01)

(58) Field of Classification Search
USPC ................................................. 428/426, 688
See application file for complete search history.

(56) References Cited

U.S. PATENT DOCUMENTS

| | | | | |
|---|---|---|---|---|
| 4,400,412 | A * | 8/1983 | Scanlon | C03C 17/245 427/109 |
| 4,401,690 | A * | 8/1983 | Greenberg | C03C 17/245 427/109 |
| 5,095,384 | A * | 3/1992 | DeNatale | G02F 1/0147 359/241 |
| 6,416,890 | B1 * | 7/2002 | Terneu | C03C 17/3417 427/166 |
| 6,440,592 | B1 * | 8/2002 | Meyer | C03C 17/245 204/192.22 |
| 8,609,253 | B2 * | 12/2013 | Chang | C09K 9/00 204/192.16 |
| 8,889,219 | B2 * | 11/2014 | Granqvist | C09K 9/00 340/636.14 |

(Continued)

FOREIGN PATENT DOCUMENTS

| | | |
|---|---|---|
| KR | 10-2011-0062385 A | 6/2011 |
| KR | 10-2013-0074157 A | 7/2013 |
| KR | 10-2015-0049326 A | 5/2015 |

*Primary Examiner* — Lauren R Colgan
(74) *Attorney, Agent, or Firm* — Stein IP, LLC

(57) ABSTRACT

A single layered smart window may include a substrate; and a single layered coating formed on the substrate, wherein the coating includes a composite of a vanadium oxide and a low reflective material. The single layered smart window has high visible light transmittance and is capable of blocking infrared ray as a temperature is increased.

6 Claims, 1 Drawing Sheet

(56) References Cited

U.S. PATENT DOCUMENTS

| | | | |
|---|---|---|---|
| 9,146,408 B2* | 9/2015 | Bae | C03C 17/3417 |
| 9,193,624 B2* | 11/2015 | Jun | C03C 17/27 |
| 9,659,681 B2* | 5/2017 | Jung | H01B 1/08 |
| 2003/0054177 A1* | 3/2003 | Jin | C03C 17/3417 |
| | | | 428/432 |
| 2007/0048438 A1* | 3/2007 | Parkin | C03C 17/245 |
| | | | 427/96.8 |
| 2008/0234126 A1* | 9/2008 | Hong | B01D 53/8628 |
| | | | 502/350 |
| 2009/0208639 A1* | 8/2009 | Yun | C01G 31/02 |
| | | | 427/126.3 |
| 2009/0253369 A1* | 10/2009 | Kruzelecky | C09K 9/00 |
| | | | 455/12.1 |
| 2010/0270519 A1* | 10/2010 | Blackman | C03C 17/245 |
| | | | 252/586 |
| 2011/0134503 A1* | 6/2011 | Shim | C03C 17/25 |
| | | | 359/288 |
| 2011/0164306 A1* | 7/2011 | Shim | C03C 17/06 |
| | | | 359/289 |
| 2011/0304901 A1* | 12/2011 | Lee | G02F 1/19 |
| | | | 359/288 |
| 2012/0026574 A1* | 2/2012 | Bae | C03C 17/245 |
| | | | 359/288 |
| 2012/0033288 A1* | 2/2012 | Lee | G02F 1/0147 |
| | | | 359/288 |
| 2012/0263930 A1* | 10/2012 | Moon | C03C 17/23 |
| | | | 428/212 |
| 2012/0301642 A1* | 11/2012 | Roberts | B82Y 20/00 |
| | | | 428/34 |
| 2013/0164511 A1* | 6/2013 | Bae | C09D 1/00 |
| | | | 428/212 |
| 2014/0001029 A1* | 1/2014 | Choi | G02F 1/009 |
| | | | 204/192.1 |
| 2014/0002886 A1* | 1/2014 | Choi | G02F 1/009 |
| | | | 359/288 |

* cited by examiner

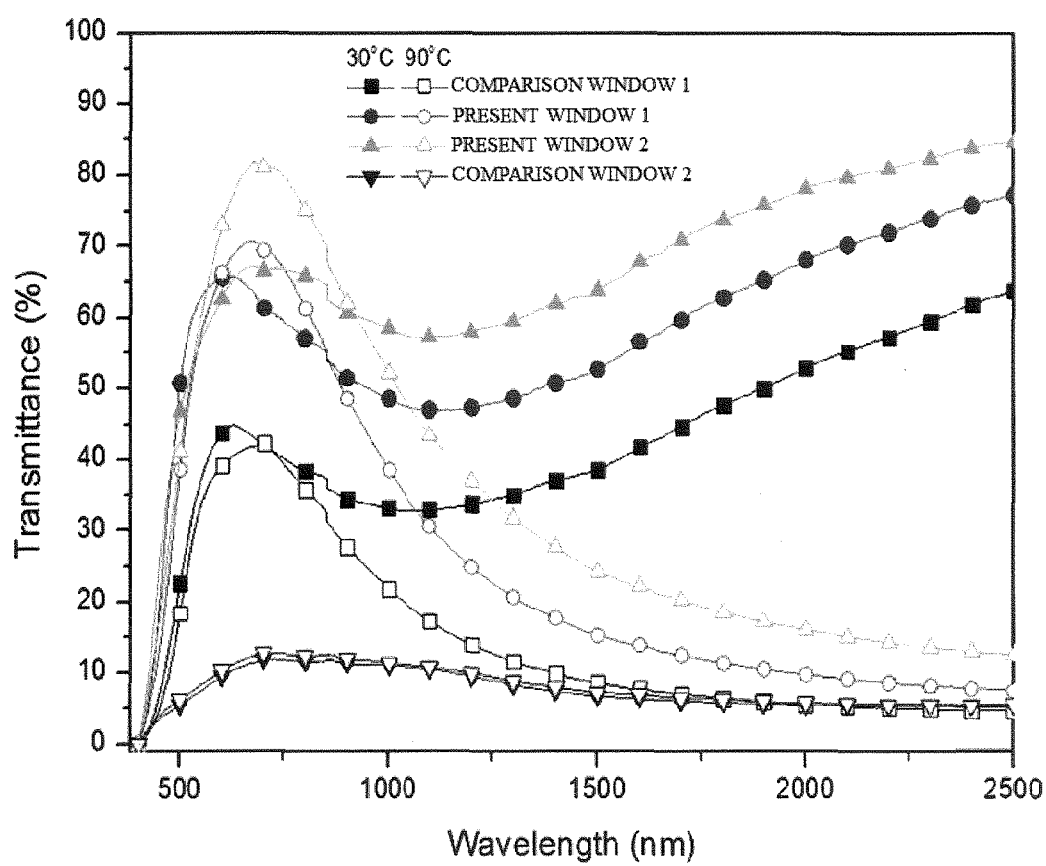

SINGLE LAYER SMART WINDOW

CROSS-REFERENCE TO RELATED APPLICATION

This application claims the benefit under 35 U.S.C. § 119(a) of Korean Patent Application No. 10-2015-0171163 filed on Dec. 3, 2015, in the Korean Intellectual Property Office, the entire disclosure of which is incorporated herein by reference for all purposes.

BACKGROUND

1. Field

The following description relates to a single layer smart window, and, more particularly, a single layer smart window having high visible light transmittance with a simple structure and a method for manufacturing the same.

2. Description of Related Art

As the cost of energy sources increases, the importance of energy saving technologies is emerging. In particular, cooling and heating accounts for a majority of energy consumption, and about 24% of the energy consumed by cooling and heating is lost through windows.

Smart window technology is an active control technology that can reduce the energy loss by freely controlling the light transmittance therethrough from the outside, and can be applied to various industrial fields such as transportation, information, display, and architecture. The existing smart window has a smart window using thermochromic property.

The thermochromic property is as follows: the crystal structure of a material changes around a specific temperature and its physical properties change rapidly. The smart window using the thermochromic property transmits visible light when the temperature exceeds a certain temperature, but it can prevent the rise of the room temperature by blocking near infrared rays and infrared rays, thereby improving energy efficiency.

However, since many materials having thermochromic properties have a high phase transition temperature, they are substantially difficult to use for smart windows. In the case of a smart window using vanadium dioxide having a relatively practical phase transition temperature, low visible light transmittance thereof may be problematic.

In order to compensate for this low visible light transmittance, a method of manufacturing a multilayer smart window by coating a substance capable of improving the transmittance on a vanadium dioxide coating film may be used. However, such a method requires an additional process and increases the processing time and cost. In addition, there is a problem that the infrared transmittance of the smart window is reduced.

Therefore, there is a need for a smart window having high visible light transmittance and a method for manufacturing the same.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

The present disclosure is to provide a smart window having high visible light transmittance with a simple structure and a method for manufacturing the same.

In one aspect, there is provided a single layered smart window comprising: a substrate; and a single layered coating formed on the substrate, wherein the coating includes a composite of a vanadium oxide and a low reflective material.

In one implementation, the vanadium oxide comprises a vanadium dioxide.

In one implementation, the low reflectivity material is at least one selected from a group consisting of alumina ($Al_2O_3$), silicon dioxide ($SiO_2$), titanium dioxide ($TiO_2$), tungsten trioxide ($WO_3$), zinc oxide (ZnO), hafnium oxide ($HfO_2$), silicon nitride (SiN), indium tin oxide (ITO), chromium oxide ($Cr_2O_3$), cerium oxide ($CeO_2$), or tin oxide ($SnO_2$).

In one implementation, the single layered coating contains a content of about 0.1% inclusive by weight to about 0.5% exclusive by weight of the low reflective material.

In one implementation, a concentration of the low reflective material has a gradient in a thickness direction in the single layered coating.

In one implementation, the single layered smart window has a visible light transmittance peak value of 65% or more at 90° C.

In one implementation, the substrate includes a transparent glass substrate, a transparent polymer substrate, or a transparent oxide substrate.

In one implementation, the single layered coating is formed on the substrate using a co-sputtering process, wherein the co-sputtering process includes sputtering first and second targets simultaneously, wherein the first target includes a vanadium metal or vanadium oxide and the second target includes at least one selected from a group consisting of alumina ($Al_2O_3$), silicon dioxide ($SiO_2$), titanium dioxide ($TiO_2$), tungsten trioxide ($WO_3$), zinc oxide (ZnO), hafnium oxide ($HfO_2$), silicon nitride (SiN), indium tin oxide (ITO), chromium oxide ($Cr_2O_3$), cerium oxide ($CeO_2$), or tin oxide ($SnO_2$).

The present disclosure can provide the single-layer smart window having a simple structure with a single layer, exhibiting high visible light transmittance, and exhibiting excellent infrared blocking ability at a temperature rise. Thus, most of the visible light transmits through the window due to its high visible light transmittance to keep the room bright. In addition, since the single-layer smart window of the present invention has the simple structure with the single layer, the manufacturing process time and cost can be reduced.

Other features and aspects may be apparent from the following detailed description, the drawings, and the claims.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

FIG. 1 is a graph for describing single layer smart windows of various embodiments according to the present disclosure.

DETAILED DESCRIPTION

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Spatially relative terms, such as "beneath," "below," "lower," "under," "above," "upper," and the like, may be used herein for ease of explanation to describe one element or feature's relationship to another element s or feature s as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure."

The single layer smart window in accordance with the present disclosure comprises a substrate and a single layered coating formed on the substrate. The coating is made of a composite of a vanadium oxide and a low reflective material.

The substrate may be formed of a transparent material having high light transmittance. For example, the substrate may be a transparent glass substrate, a transparent polymer substrate, a transparent oxide substrate, or the like.

The single layered coating may be formed by simultaneously co-sputtering the vanadium compound and the low reflection material on the substrate. By simultaneously depositing the vanadium compound and the low reflective material on the substrate, the single layer smart window in accordance with the present disclosure has a simple structure composed of a single layer and can reduce the manufacturing process, time, and cost. In addition, it can exhibit high light transmittance.

The vanadium compound may comprise vanadium oxide. For example, the single layer smart window may include vanadium dioxide ($VO_2$) as the vanadium compound. The vanadium dioxide is a material having a thermochromic property which is phase-changed at a temperature of 68° C. Specifically, the vanadium dioxide has a monoclinic crystal structure showing high infrared ray transmittance at a temperature below 68° C. inclusive. However, at a temperature exceeding 68° C., the crystal structure thereof is phase-changed into a tetragonal crystal structure, which exhibits low infrared transmittance. Therefore, it is possible using these characteristics to construct a smart window that can automatically shut off infrared rays when the temperature rises The low reflective material may comprise at least one of oxide or nitride. For example, the low reflectivity material may be at least one selected from the group consisting of alumina ($Al_2O_3$), silicon dioxide ($SiO_2$), titanium dioxide ($TiO_2$), tungsten trioxide ($WO_3$), zinc oxide (ZnO), hafnium oxide ($HfO_2$), silicon nitride (SiN), indium tin oxide (ITO), chromium oxide ($Cr_2O_3$), cerium oxide ($CeO_2$), or tin oxide ($SnO_2$). The low reflective material together with the vanadium oxide may be contained in the single layer smart window, to improve the transmittance of the single layer smart window.

In one embodiment, the single layered coating may be formed on the substrate using a co-sputtering process that simultaneously uses the vanadium metal or vanadium oxide as a first target and the low reflection material as a second target. Specifically, the first target includes a vanadium metal or a vanadium oxide, and the second target includes at least one selected from a group consisting of alumina ($Al_2O_3$), silicon dioxide ($SiO_2$), titanium dioxide ($TiO_2$), tungsten trioxide (WO$_3$), zinc oxide (ZnO), hafnium oxide (HfO$_2$), silicon nitride (SiN), indium tin oxide (ITO), chromium oxide (Cr$_2$O$_3$), cerium oxide (CeO$_2$), or tin oxide (SnO$_2$). The co-sputtering process may be executed by sputtering the first and second targets concurrently.

In this connection, it is possible to form the single layered coating in which the concentration of the low reflection material is uniform. Alternatively, the concentration of the low reflective material may have a gradient in the single layered coating. Specifically, as the distance from the outer surface of the single layered coating to the substrate increases, the concentration of the low reflective material increases or decreases. This may be achieved by sputtering the first and second targets with different sputtering energies.

In one embodiment, the single layered coating may contain a content of about 0.1% inclusive by weight to about 0.5% exclusive by weight of the low reflective material. For example, the single layered coating may be formed of a composite in which the low reflective material is mixed with a matrix of the vanadium compound with a content of about 0.1% inclusive by weight to about 0.5% exclusive by weight of the low reflective material over the vanadium compound. In this connection, the concentration of the low reflection material is uniform in the matrix. Alternatively, the concentration of the low reflective material may have a gradient in the single layered coating.

When the single layered coating contains less than 0.1% by weight of the low reflective material, the visible light transmittance of the single layer smart window may not be improved. When the low reflective material comprises a content of more than or equal to 0.5% by weight, the thermochromic characteristics of the smart window may not appear.

Further, the single layer smart window may have a visible light transmittance peak value of 65% or more, and preferably 80% or more.

Hereinafter, the single layer smart window in accordance with the present disclosure will be described in more detail with specific examples.

EXAMPLE 1

To fabricate a single layer smart window according to an example 1 of the present invention, vanadium dioxide was used as the vanadium oxide and alumina was as the low reflection material.

0.1 wt % alumina over the vanadium dioxide and the vanadium dioxide were co-sputtered simultaneously onto a glass substrate to prepare a single layer smart window (hereinafter, the present smart window 1) according to example 1 of the present invention.

EXAMPLE 2

To fabricate a single layer smart window according to an example 2 of the present invention, vanadium dioxide was used as the vanadium oxide and alumina was as the low reflection material.

0.3 wt % alumina over the vanadium dioxide and the vanadium dioxide were co-sputtered simultaneously onto a glass substrate to prepare a single layer smart window (hereinafter, the present smart window 2) according to example 2 of the present invention.

COMPARISON EXAMPLE 1

To fabricate a single layer smart window according to a comparison example 1, only vanadium dioxide was used as the vanadium oxide, and the low reflection material was absent.

The vanadium dioxide was sputtered or deposited onto a glass substrate to prepare a single layer smart window (hereinafter, a comparison smart window 1) according to the comparison example 1.

COMPARISON EXAMPLE 2

To fabricate a single layer smart window according to a comparison example 2, vanadium dioxide was used as the vanadium oxide and alumina was as the low reflection material.

In this example, 0.5 wt % alumina over the vanadium dioxide and the vanadium dioxide were co-sputtered simultaneously onto a glass substrate to prepare a single layer smart window (hereinafter, a comparison smart window 2) according to the comparison example 2.

Characteristics of Present Smart Windows 1 and 2

FIG. 1 is a graph showing transmittances in visible and infrared regions of the present smart windows 1 and 2 and comparative windows 1 and 2. The transmittances of the present smart windows 1 and 2 and comparison windows 1 and 2 were measured at 30° C. and 90° C., respectively.

Table 1 below shows the results of measuring the transmittance peak value and transmittance difference between the present smart windows 1 and 2 and comparison windows 1 and 2, respectively with reference to FIG. 1.

TABLE 1

|  | Transmittance peak value (TR$_{vis}$) (%) 30° C. | Transmittance peak value (TR$_{vis}$) (%) 90° C. | Transmittance difference (ΔTR) (%) |
|---|---|---|---|
| Comparison window 1 | 40.6 | 42.6 | 58.9 |
| Present smart window 1 | 65.9 | 70.8 | 69.6 |
| Present smart window 2 | 67.2 | 82.0 | 72.0 |
| Comparison window 2 | 11.9 | 12.8 | none |

In Table 1, TR$_{vis}$ represents the transmittance peak value in the visible region, and ΔTR represents the difference between transmittance peak values at 30° C. and 90° C. at a wavelength of 2500 nm.

Referring to FIG. 1 together with Table 1, the present smart window 1 and 2 according to the examples 1 and 2 of the present invention exhibit high visible transmittance peak values at 30° C. and 90° C., whereas the comparison window 1 and comparison window 2 exhibit low transmittance peak values. Moreover, it can be seen that the present smart windows 1 and 2 exhibit higher visible light transmittances as well as excellent IR blocking in the infrared region as the temperature rises.

Specifically, at 30° C., the present smart windows 1 and 2 exhibited high transmittance peak values of about 66% and 68%, respectively, while the comparison window 1 showed the low transmittance peak value of about 41%. Further, at 90° C., the present smart window 1 and 2 showed high transmittance peak values of about 71% and 82%, respectively, while the comparison window 1 showed a low transmittance peak value of about 43%.

In addition, as the temperature rises, the visible window transmittance peak value of the comparison window 1 is increased by about 2%, in other words, has no substantial change of the visible window transmittance, while each of the visible window transmittance peak value of the smart windows 1 and 2 is increased by about 5%, in other words, the visible light transmittance is improved.

This means that the present smart windows 1 and 2, each of which includes the single coating film containing both alumina and vanadium dioxide, exhibit higher transmittance in the visible region than the comparison window 1, which does not contain alumina and contains only a vanadium dioxide in the single coating film. That is, it can be shown that the inclusion of alumina can improve the visible light transmittance of the smart window.

Furthermore, when comparing the transmittances in the infrared region due to the temperature rise from 30° C. to 90° C., the present smart windows 1 and 2 show about 70% and 72% of differences between infrared transmittances at 30° C. and 90° C. respectively, while the comparison example 1 shows that the difference between infrared transmittances at 30° C. and 90° C. is about 59%, which is lower relative to the smart windows 1 and 2, although it blocks infrared rays at the temperature rise.

Therefore, it can be confirmed that the present smart window including the single coating film containing the vanadium oxide and low reflection material exhibits high visible light transmittance, and exhibits further improved visible light transmittance and excellent infrared ray blocking efficiency at the time of temperature rise.

Comparing the present windows 1 and 2 according to the example 1 and 2 of the present invention with the comparison window 2 according to the comparison example 2, wherein the comparison window 2 contains 0.5 wt % alumina and vanadium dioxide, the comparison window 2 shows very low transmittance over all of wavelengths. In other words, it can be seen that the comparison window 2 does not show infrared blocking due to the thermochromic characteristics. This means that if the film contains a content equal or more than 0.5% by weight of the low-reflectance material, the thermochromic characteristic may not be present. Thus, the smart window preferably contains less than 0.5% by weight of the low-reflectance material.

Moreover, when comparing the present smart windows 1 and 2 with each other, both smart windows 1 and 2 exhibited excellent visible transmittance peak value and infrared blocking due to temperature rise. However, compared with the present smart window 1 containing 0.1 wt % alumina, the visible window transmittance peak value and the infrared blocking property of the present smart window 2 including 0.3 wt % alumina are better. This means that the single layer smart window of the present invention most preferably comprises 0.3% by weight of the low reflective material.

While the disclosure has been shown and described with reference to certain exemplary embodiments thereof, it will be understood by those skilled in the art that various changes in form and details may be made therein without departing from the scope of the disclosure as defined by the appended claims.

What is claimed is:

1. A single layered smart window comprising:
a substrate; and
a single layered coating formed on the substrate, the coating including a composite of a vanadium oxide and a low reflective material,
wherein the low reflectivity material comprises at least one selected from a group consisting of alumina ($Al_2O_3$), titanium dioxide ($TiO_2$), zinc oxide (ZnO), hafnium oxide ($HfO_2$), silicon nitride (SiN), indium tin oxide (ITO), chromium oxide ($Cr_2O_3$), cerium oxide ($CeO_2$), and tin oxide ($SnO_2$).

2. The window of claim 1, wherein the vanadium oxide comprises a vanadium dioxide.

3. The window of claim 1, wherein a content of the low reflective material in the single layered coating is in a range of about 0.1 wt. % to about 0.5 wt. %.

4. The window of claim 3, wherein a concentration of the low reflective material is variable according to a thickness direction in the single layered coating.

5. The window of claim 1, wherein the single layered smart window has a visible light transmittance peak value of about 65% or more at 90° C.

6. The window of claim 1, wherein the substrate comprises one selected from a group consisting of a transparent glass substrate, a transparent polymer substrate, and a transparent oxide substrate.

* * * * *